(12) United States Patent
Mead et al.

(10) Patent No.: US 6,541,731 B2
(45) Date of Patent: Apr. 1, 2003

(54) USE OF MULTIPLE LASER SOURCES FOR RAPID, FLEXIBLE MACHINING AND PRODUCTION OF VIAS IN MULTI-LAYERED SUBSTRATES

(75) Inventors: Roy D. Mead, Lynnwood, WA (US); Jeffrey W. Pierce, Monroe, WA (US)

(73) Assignee: Aculight Corporation, Bothell, WA (US)

( * ) Notice: Subject to any disclaimer, the term of this patent is extended or adjusted under 35 U.S.C. 154(b) by 0 days.

(21) Appl. No.: 09/765,089

(22) Filed: Jan. 16, 2001

(65) Prior Publication Data

US 2002/0000426 A1 Jan. 3, 2002

Related U.S. Application Data

(60) Provisional application No. 60/178,085, filed on Jan. 25, 2000.

(51) Int. Cl.$^7$ .................. B23K 26/00; B23K 26/14; H01S 3/11
(52) U.S. Cl. ............... 219/121.7; 219/121.71; 219/121.72; 219/121.61; 219/121.68; 372/10; 372/12
(58) Field of Search ............ 219/121.7, 121.6, 219/121.68, 121.69, 121.61, 121.71, 121.72, 121.67, 121.73, 121.76; 372/10, 12

(56) References Cited

U.S. PATENT DOCUMENTS

| | | | | |
|---|---|---|---|---|
| 4,789,770 A | * | 12/1988 | Kasner et al. | 219/121.7 |
| 4,870,244 A | * | 9/1989 | Copley et al. | 219/121.61 |
| 5,057,664 A | | 10/1991 | Johnson et al. | 219/121.69 |
| 5,164,565 A | * | 11/1992 | Addiego et al. | 219/121.6 |
| 5,197,074 A | * | 3/1993 | Emmons et al. | 372/10 |
| 5,293,389 A | * | 3/1994 | Yano et al. | 372/21 |
| 5,436,027 A | * | 7/1995 | Offer | 219/121.68 |
| 5,571,429 A | * | 11/1996 | Smith et al. | 219/121.68 |
| 5,593,606 A | | 1/1997 | Owen et al. | 219/121.71 |
| 5,614,114 A | | 3/1997 | Owen | 219/121.66 |
| 5,790,574 A | * | 8/1998 | Rieger et al. | 372/12 |
| 5,841,099 A | | 11/1998 | Owen et al. | 219/121.69 |
| 5,968,036 A | * | 10/1999 | Goodman et al. | 219/121.61 |
| 6,031,201 A | * | 2/2000 | Amako et al. | 219/121.68 |
| RE37,376 E | * | 9/2001 | Gelbart | 347/239 |
| 6,335,941 B1 | * | 1/2002 | Grubb et al. | 359/179 |
| 6,396,069 B1 | * | 5/2002 | MacPherson et al. | 372/108 |

OTHER PUBLICATIONS

D. Moser, "Solid State UV Laser Applications in Electronics", 2000 Laser Marketplace Seminar, Jan. 26, 2000.
H. Matsumoto et al.m "Practical Experience With Microvia Formation in High Density PWBS and Organic Chip Carriers Using Diode–Pumped Ultraviolet Lasers", Electronic Circuits World Convention 8, Tokyo 99, pp, H2–1—H2–1–8.
S. Raman et al., "Successful Implementation of UV Laser Drilling Technology in High Volume Production: A Board Fabricator's Perspective", Electronic Circuits World Convention 8, Tokyo 99, pp. H2–2—H2–2–7.
D.W. Couts and J.A. Piper, IEEE Journal of Quantum Electronics, vol. 28, No. 8, Aug. 1992, pp. 1761.

* cited by examiner

Primary Examiner—Tom Dunn
Assistant Examiner—L. Edmondson
(74) Attorney, Agent, or Firm—Bingham, McCutchen, LLP; David G. Beck

(57) ABSTRACT

A laser via drilling system, and a method of use thereof, is provided. The apparatus uses two or more laser systems to achieve processing parameter flexibility. The output beams from the independently controlled laser systems are combined using a beam splitter that combines the beams into single or multiple processing beams. The operational flexibility of the system can be further enhanced through the use of multiple EO modulators and a polarization sensitive beam splitter.

25 Claims, 5 Drawing Sheets

USE OF MULTIPLE LASER SOURCES FOR RAPID, FLEXIBLE MACHINING AND PRODUCTION OF VIAS IN MULTI-LAYERED SUBSTRATES

CROSS-REFERENCES TO RELATED APPLICATIONS

This application claims priority of provisional patent application Ser. No. 60/178,085 filed Jan. 25, 2000, the disclosure of which is incorporated herein by reference for all purposes.

FIELD OF THE INVENTION

The present invention relates generally to via drilling systems and, more particularly, to a method and apparatus for achieving improved parameter control in a laser drilling system.

BACKGROUND OF THE INVENTION

Microcircuit boards, semiconductor circuits, and a variety of other devices commonly used by the electronics and aerospace industries require multi-layered, multi-compositional materials. These materials can, for example, utilize alternating layers of metallic and non-metallic materials. Different metallic layers can be comprised of different metals (e.g., aluminum, copper, palladium, platinum, silver, nickel, or other metal or metal alloy) while different non-metallic layers can be comprised of different non-metallic materials (e.g., epoxy-bonded fiberglass, phenolic, polyimide, etc.). Utilization of such multi-layered, multi-compositional materials requires a variety of manufacturing techniques, including the ability to drill holes or vias in the material. Vias can either be blind vias (e.g., a via that only passes through a portion of the material's layers) or through-hole vias (e.g., a via that passes through the entire material).

Although traditional drilling techniques are suitable for a variety of applications, they are typically not well suited for drilling extremely small vias in densely packed configurations. Accordingly, a lot of emphasis has been placed on developing alternate drilling techniques. One such alternate technique is laser drilling utilizing any of a variety of lasers including excimer lasers, $CO_2$ lasers, and solid-state lasers.

Due to the requirements placed on wavelength, beam quality, pulse length, repetition rate, and output power, many applications presently use either a diode-pumped or lamp-pumped Nd:YAG, Nd:YLF, Nd:YAP, or Nd:YVO$_4$ laser. Typically the laser is continuously pumped and laser pulses are produced by Q-switching with an electro-optic or acousto-optic modulator. To achieve the desired output wavelength, generally either the third harmonic or the fourth harmonic of the output of the laser is used.

FIG. 1 is a graph of the output power versus pulse rate for a third harmonic laser in a conventional via drilling system. As shown, the output power of the laser is highly dependent upon the repetition rate of the pump laser. As the repetition rate is increased from a few kilohertz to tens of kilohertz, the pulse energy decreases and the pulse duration lengthens. The peak power of the pulses, which is nominally proportional to the energy divided by the pulse duration, decreases dramatically at high repetition rates. Since the conversion of radiation to shorter wavelengths is driven by peak power, conversion efficiency drops off as the peak power decreases. Accordingly, a laser drilling system using such a laser typically operates at a repetition rate of approximately 1–3 kilohertz. Lasers optimized for higher repetition rates can be used, however such lasers typically have lower per pulse energies, even when operated at low repetition rates.

U.S. Pat. Nos. 5,593,606 and 5,614,114 disclose an ultra-violet laser system for use in drilling vias in multi-layered materials. The system uses the fourth harmonic of a laser based on a solid-state lasant such as Nd:YAG, Nd:YLF, Nd:YAP, or Nd:YVO$_4$. The output beam of the disclosed laser system has a temporal pulse width shorter than about 100 nanoseconds, typically from about 40–90 nanoseconds or lower. The average power of the laser is about 100 milliwatts with a spot size diameter of between 10 and 50 microns. A repetition rate of greater than 200 hertz is disclosed with a preferred repetition rate of between 1 and 5 kilohertz. As a result of the low repetition rates, the disclosed system was only able to drill 51 micron vias at a rate of 3.9 holes per second in a 190.5 micron thick, three layer composite comprised of copper, FR4, and copper. The throughput for the same size via in a 178 micron thick composite of copper, liquid crystal polymer, and copper was 4.5 holes per second.

Although a variety of laser drilling systems have been designed, these systems typically provide the user with only a limited ability to alter critical system parameters such as repetition rate, temporal pulse width, and output power. Accordingly, what is needed in the art is a laser drilling system that allows the user the ability to alter system characteristics to match the desired application. The present invention provides such a system.

SUMMARY OF THE INVENTION

The present invention provides a laser via drilling system, and a method of use, in which critical material processing parameters such as laser pulse repetition rate, pulse duration, and fluence level are varied to meet the requirements of the material being processed. The system uses two or more independent laser systems, each of which preferably uses the third or fourth harmonic of a solid-state fundamental laser. The output beams from each of the laser systems are combined into one or more processing beams using a beam splitter. The operational flexibility of the system can be further enhanced through the use of multiple electro-optical (EO) modulators and a polarization sensitive beam splitter.

In one embodiment of the invention, the pulse repetition rate of each of two independent laser systems is maximized and set at substantially the same rate. The pulses from each laser are staggered, thereby achieving a pulse repetition rate in the combined processing beam that is twice that achievable by either of the individual lasers. Depending upon whether the individual output beams are combined into one or two processing beams, the output fluence per pulse is either equivalent to or half the fluence per pulse achievable by either of the individual lasers.

In another embodiment of the invention, an identical pulse repetition rate for each of two independent laser systems is selected. The pulse delay between the first and second laser system is selected to be comparable to the pulse width, thereby achieving long pulse duration within the processing beam without sacrificing the extraction efficiency of either of the individual lasers.

In yet another embodiment of the invention, an identical pulse repetition rate for at least two independent laser systems is selected with zero pulse delay between the systems. By combining the individual output beams into a single processing beam, the output fluence per pulse is doubled.

In yet another embodiment of the invention, an identical pulse repetition rate for each of two independent laser systems is selected with zero pulse delay between the two systems. The individual output beams are combined using a polarization sensitive beam splitter. The combined processing beam is comprised of beams of differing polarizations, thus helping to alleviate undesired asymmetric etching/cutting rates for certain materials.

In yet another embodiment of the invention, each output beam from two independent laser systems passes through an EO modulator prior to impinging upon a polarizing beam splitter. Depending upon the condition of each of the EO modulators, each of the output beams can be directed along either of two processing beam paths.

A further understanding of the nature and advantages of the present invention may be realized by reference to the remaining portions of the specification and the drawings.

DESCRIPTION OF THE SPECIFIC EMBODIMENTS

Figure 1:
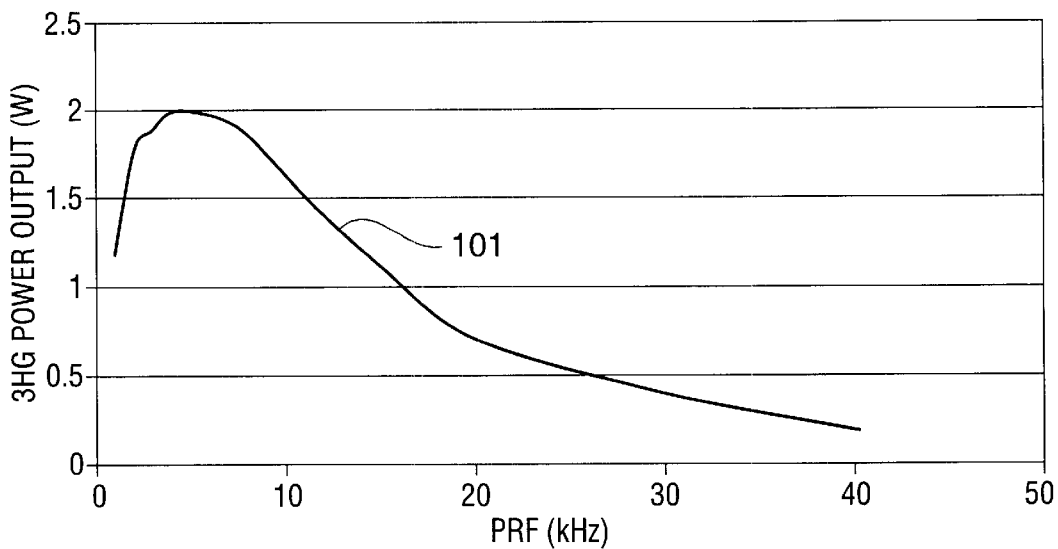
FIG. 1 is a graph of the output power versus pulse rate for a third harmonic laser in a conventional via drilling system.
Figure 2:
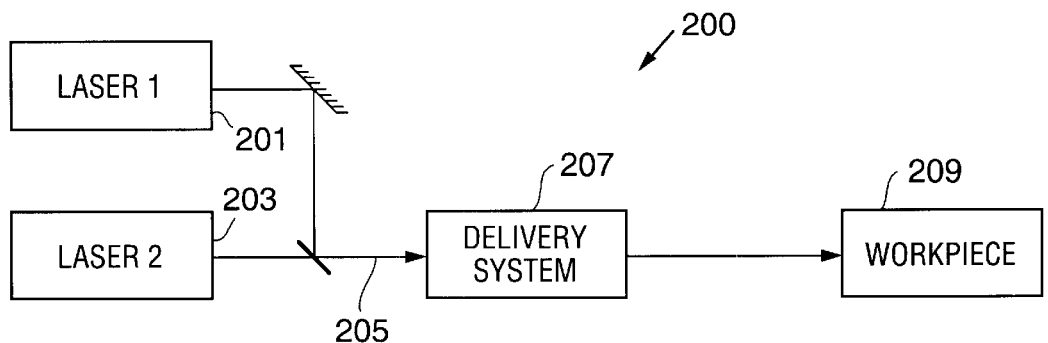
FIG. 2 is a block diagram of the basic system in accordance with the invention.

FIG. 2 conceptually illustrates the present invention. As shown, the output from at least two lasers, e.g., lasers 201 and 203 in the illustrated embodiment, are coupled together to form a single output beam 205. Beam 205 passes through a suitable beam delivery system 207 to work piece 209. Depending upon the desired application, the position of output beam 205 relative to work piece 209 can be manipulated via delivery system 207, via multi-axes translation stages coupled to work piece 209, or both. Delivery system 207 can be comprised of fiber optics and/or conventional optical elements such as lenses (e.g., beam expanding and telecentric lenses), steering mirrors, etc. In addition to providing a means of delivering output beam 205 to work piece 209, delivery system 207 can also be used to condition beam 205, for example using spatial filters.

Figure 3:
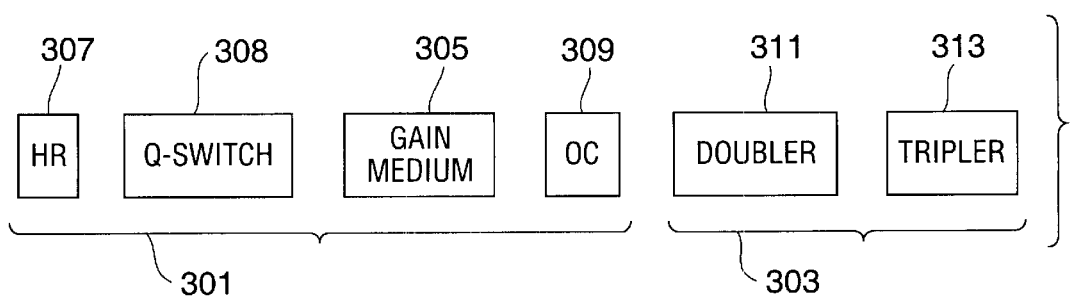
FIG. 3 is a detailed illustration of a laser suitable for use with the invention.

As shown in FIG. 3, in the preferred embodiment of the invention lasers 201 and 203 are each comprised of a fundamental laser 301 and a nonlinear optical converter 303. Laser 301 is comprised of a gain medium 305 such as Nd:YLF, Nd:YAG, or Nd:YVO$_4$, a high reflector 307, a Q-switch 308, and an output coupler 309. The fundamental beam from laser 301 passes through a frequency doubler 311 that converts at least a portion of the fundamental frequency to a second harmonic. A second crystal 313 mixes unconverted fundamental radiation with the second harmonic to produce the third harmonic. Preferably crystal 311 is comprised of Type II KTP although other crystal materials such as Type I BBO or LBO can be used. Preferably crystal 313 is comprised of CLBO although other crystal materials such as BBO can be used. It is understood that the selection of gain medium 305 and crystals 311 and 313 is based, at least in part, on the desired characteristics (e.g., wavelength, pulse length, output power, etc.) of lasers 201 and 203. It is also understood that nonlinear optical converter 303 can be either an external cavity converter as shown, or an intracavity converter; that the individual system lasers (e.g., lasers 201 and 203 of FIG. 2) need not be identical; and that the system is not limited to third harmonic converted lasers (e.g., fourth or fifth harmonic converted lasers can also be used).

Figure 4:
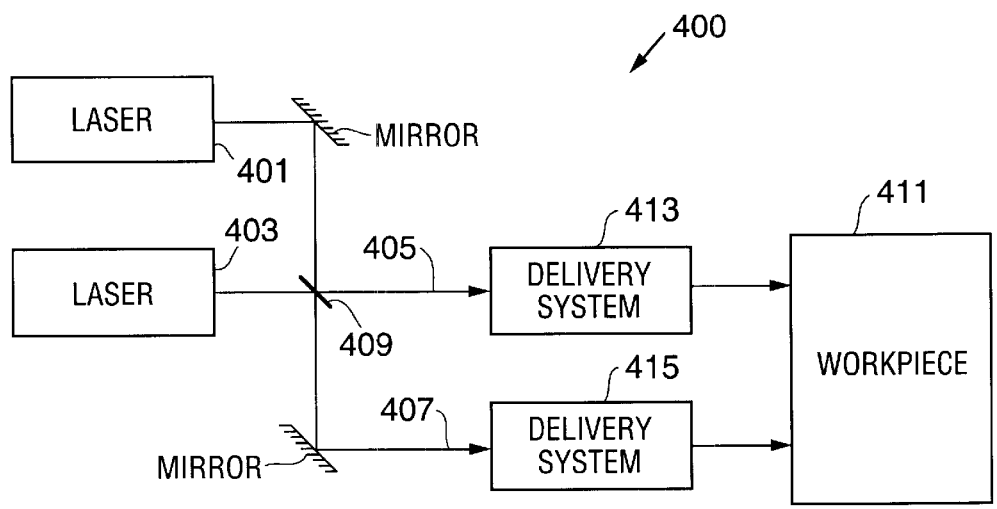
FIG. 4 is an illustration of an embodiment of the invention utilizing two laser systems that operate independently to achieve the desired output characteristics.

FIG. 4 is an illustration of one embodiment of the invention. This embodiment uses two laser systems 401 and 403, each outputting a third harmonic of a fundamental beam produced by a lamp-pumped or diode-pumped Nd:YAG, Nd:YLF, or Nd:YVO$_4$ or other laser. Preferably the lasers are continuously pumped with pulses being produced by Q-switching with either an electro-optic or acousto-optic modulator. Each of these laser systems is capable of efficiently operating at a repetition rate of between 5 and 30 kilohertz, and more efficiently operating at a repetition rate of between 5 and 20 kilohertz with an output energy of between 1 and 0.125 millijoules, respectively. The energy of beams 405 and 407 depend upon the characteristics of beam splitter 409. For example, assuming a 50/50 splitter, each beam 405 and 407 can provide between 1 and 0.0625 millijoules of energy at a repetition rate of between 5 and 40 kilohertz. Output beams 405 and 407 are directed to a workpiece 411 by beam delivery systems 413 and 415, respectively. It is understood that beam delivery systems 413 and 415 can deliver beams to a single location on workpiece 411, multiple locations on workpiece 411, or locations on two different workpieces (not shown).

Figure 5:
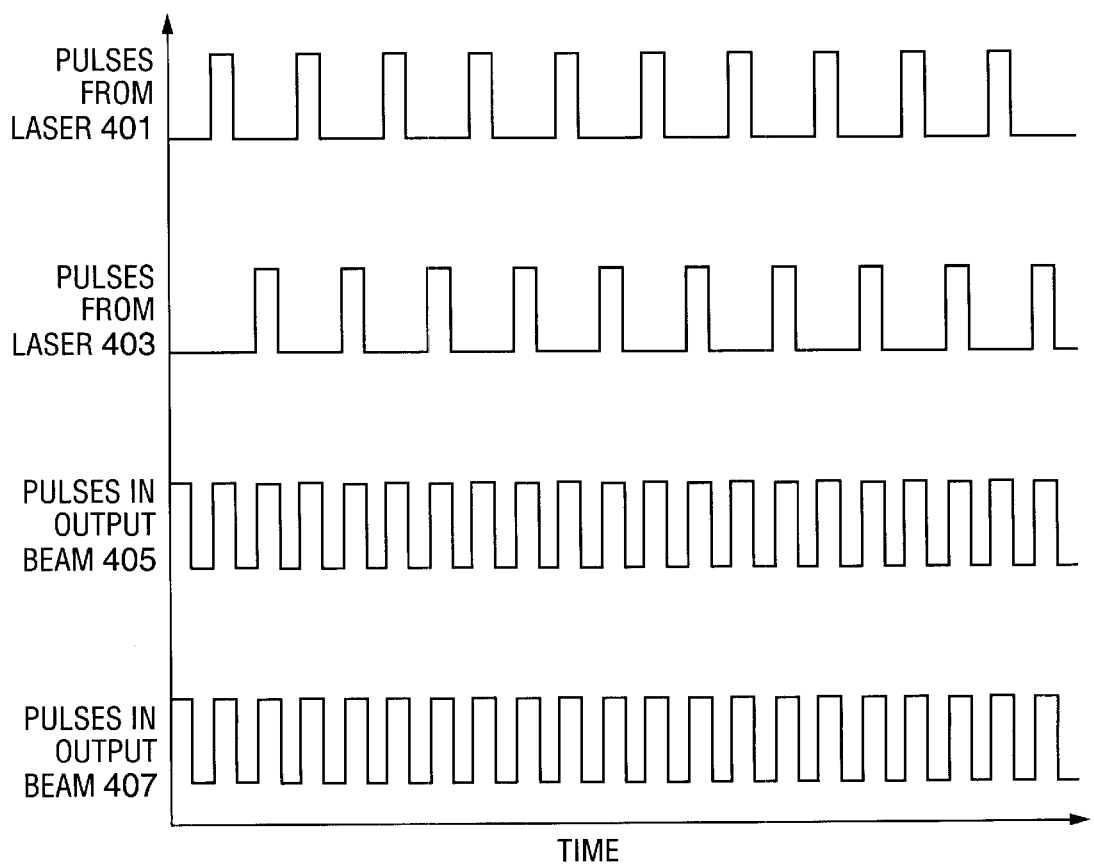
FIG. 5 graphically illustrates one application specific configuration for the system shown in FIG. 4, whereby each laser system operates at 20 kilohertz with a pulse width of 100 nanoseconds and whereby the firings from the two laser systems are staggered by 25 microseconds.

The use of two or more independent laser systems allows system 400 to be configured and efficiently utilized for a variety of applications. For example, as shown in FIG. 5, by operating each laser system at an equivalent and maximum repetition rate and offsetting the pulses from each laser, a pulse rate of twice the individual maximum rate can be achieved in both output beams 405 and 407. For purposes of this exemplary embodiment, each laser operates at 20 kilohertz with a pulse width of 100 nanoseconds. The pulses from laser system 403 are delayed from the pulses of laser system 401 by 25 microseconds.

Figure 6:
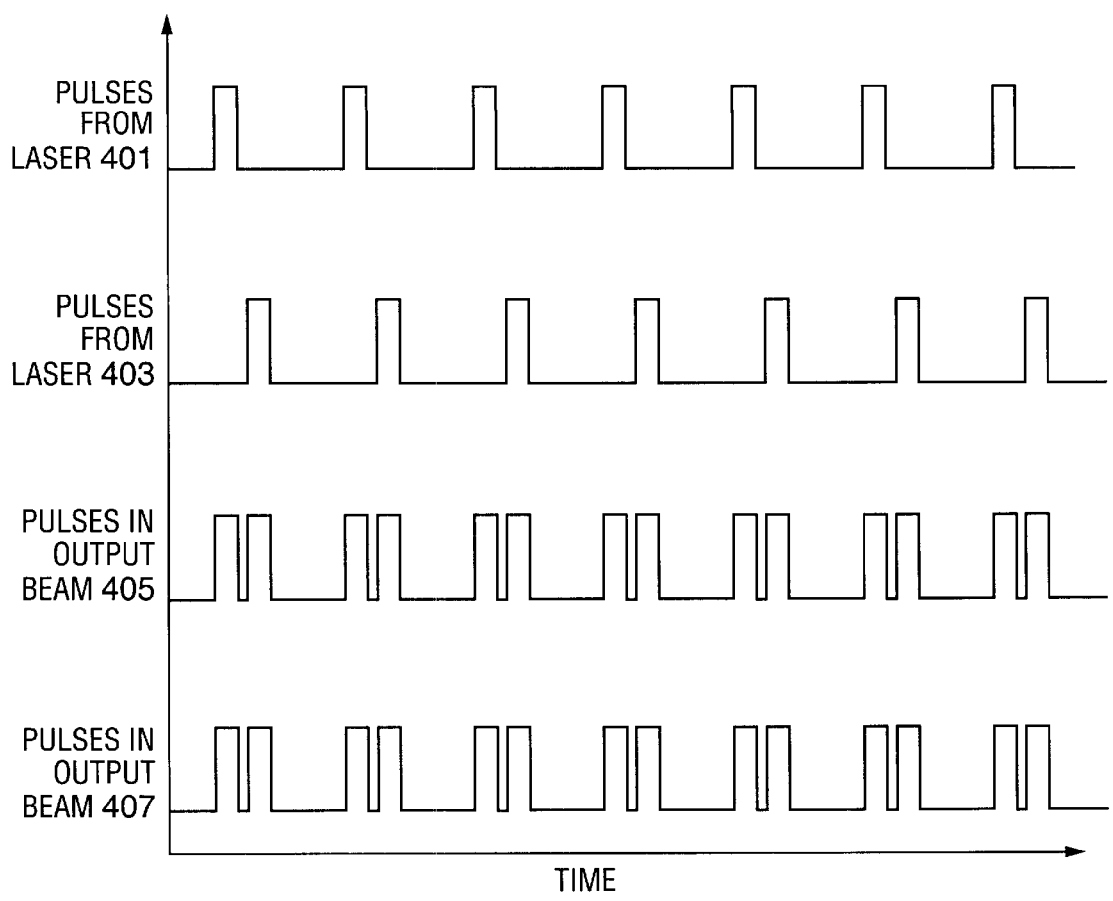
FIG. 6 graphically illustrates an alternate application specific configuration for the system shown in FIG. 4, whereby each laser system operates at a repetition rate of 10 kilohertz with pulse widths of 50 nanoseconds and whereby the delay between laser firings is 150 nanoseconds.

In an alternate configuration shown in FIG. 6, the firings of the two laser systems can be staggered by a sufficient amount to achieve dual pulses with a minor, and controllable, time delay between pulses. This configuration can be used, for example, to allow the second pulse to arrive at the irradiation region after the plume of ejecta has substantially cleared but prior to the surface of the material reaching thermal equilibrium. In the exemplary embodiment shown in FIG. 6, each laser operates at a repetition rate of 10 kilohertz with pulse widths of 50 nanoseconds. The delay between firings is 150 nanoseconds.

Figure 7:
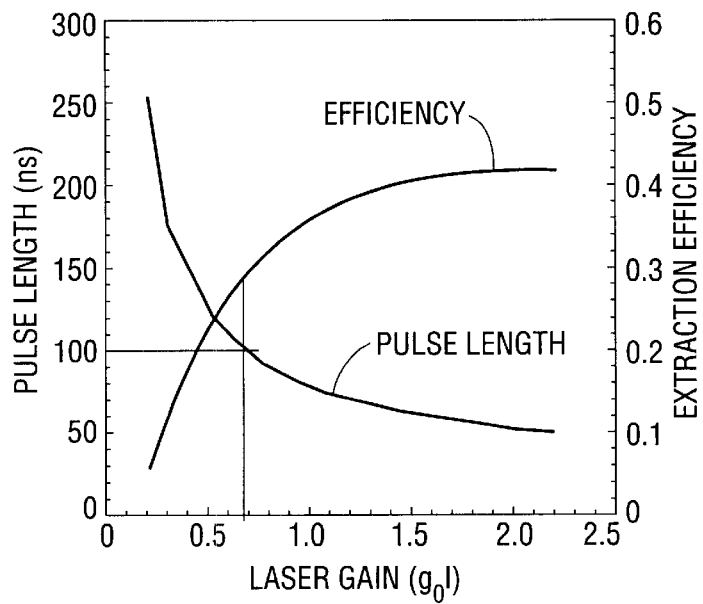
FIG. 7 graphically illustrates the extraction efficiency of a Nd:YLF laser with a 75 centimeter long cavity, 10 percent passive loss, and an intracavity third harmonic generator.

In the processing of certain materials, it is advantageous to reduce the peak power of the applied pulses while still achieving substantial fluence, or energy, at the irradiation zone. Achieving these conditions requires a long pulse length. Typically, however, producing a moderately long pulse, on the order of 100 nanoseconds, requires that the solid-state laser be operated inefficiently, either using a long cavity or operating at relatively low gain. The extraction efficiency of a Nd:YLF laser with a 75 centimeter long cavity, 10 percent passive loss, and an intracavity third harmonic generator is shown in FIG. 7. As illustrated, although pulse lengths greater than 100 nanoseconds can be generated by such a laser, a gain of less than 0.7 must be used, thus reducing extraction efficiency to less than 30 percent.

Figure 8:
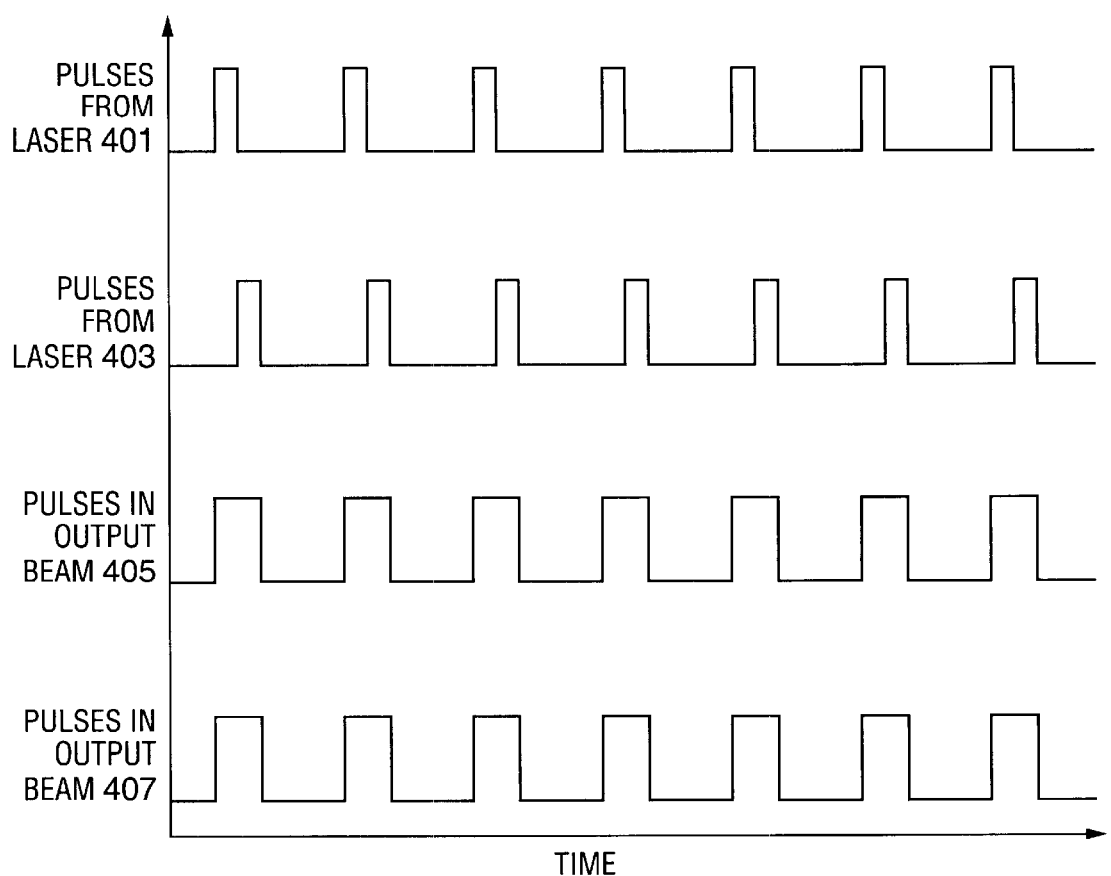
FIG. 8 graphically illustrates an alternate application specific configuration for the system shown in FIG. 4 that allows 100 nanosecond pulses to be achieved with extraction efficiencies greater than 40 percent.

FIG. 8 illustrates an alternate configuration of system 400 that allows 100 nanosecond pulses to be achieved with extraction efficiencies greater than 40 percent. In this configuration each laser operates at a repetition rate of 5 kilohertz with pulse widths of 50 nanoseconds. By delaying the firings of laser system 403 by an amount comparable to the pulse width, i.e., 50 nanoseconds, the output pulses in beams 405 and 407 have a duration of approximately twice that of a single laser operating alone.

It will be understood that the present invention is not limited to the specific operational configurations described with reference to FIGS. 5–6 and 8. For example, the amount of delay between laser system firings can be varied to accommodate any application requirement ranging from zero or near zero delay to a delay sufficient to provide equally spaced pulses. Thus the pulse shape, pulse rate, and pulse length of output beams 405 and 407 can be controlled by independently varying the repetition rates of the two laser systems and the delay between laser system firings. Additional control over output beams 405 and 407 is achieved by independently tailoring the pulse widths and the pulse powers of the two laser systems.

Figure 9:
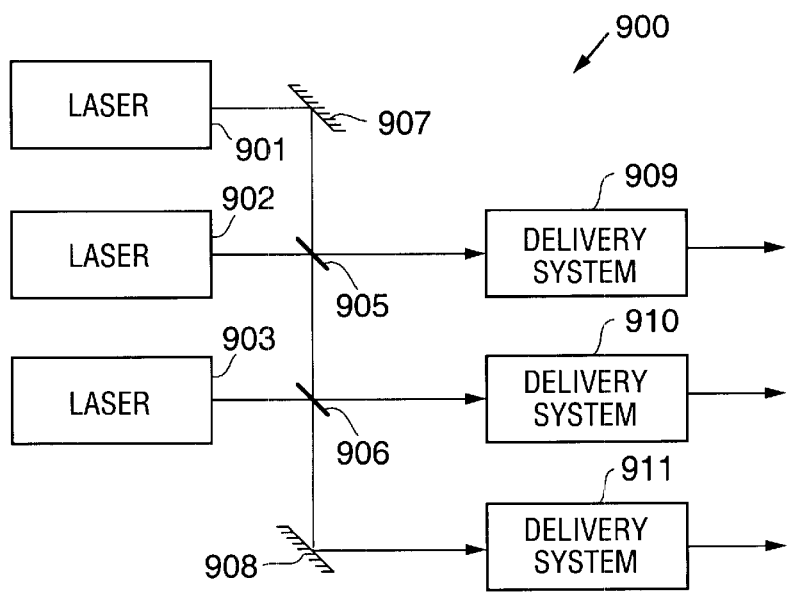
FIG. 9 is an illustration of an alternate embodiment of the invention utilizing three laser systems that operate independently to achieve the desired output characteristics.

It will also be understood that the present invention is not limited to using two independently controlled laser systems. For example, by adding a third laser system it is possible to achieve greater control over the pulse characteristics of the system output beams. Additional laser beams can be added using a variety of techniques well known to those of skill in the art such as partially reflective beam splitters, polarization sensitive beam splitters, etc. For example, system 900 shown in FIG. 9 is comprised of three laser systems 901–903, beam splitters 905–906, mirrors 907–908, and beam delivery systems 909–911. It is understood that the invention is not limited to either this optical arrangement or the one illustrated in FIG. 4, and that systems 400 and 900 are only meant to illustrate exemplary techniques of combining two (e.g., system 400) or more (e.g., system 900) laser systems to provide the user with the desired flexibility in repetition rate and pulse characteristics.

Figure 10:
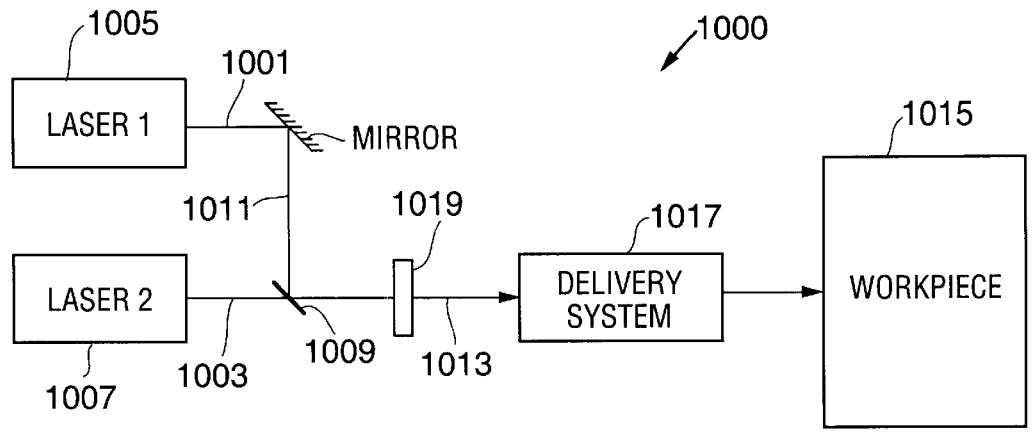
FIG. 10 is an illustration of an alternate embodiment of the invention in which the output from two independent laser systems is combined with a polarizing beam splitter.

FIG. 10 is an illustration of an alternate embodiment of the invention in which the output from two independent laser systems is combined to provide a single beam for use with a via drilling system. In this embodiment output beams 1001 and 1003 from lasers 1005 and 1007, respectively, are combined with a polarization sensitive beam combiner 1009. Polarization sensitive beam combiner 1009 can be, for example, a cube polarizer. In the preferred embodiment, lasers 1005 and 1007 are of the same type as lasers 401 and 403. A requirement of this embodiment is that beams 1003 and 1011 have different polarizations such that polarization sensitive beam combiner 1009 passes beam 1003 and reflects beam 1011, thereby achieving a single output beam 1013. Beam 1013 is delivered to workpiece 1015 by beam delivery system 1017.

The embodiment illustrated in FIG. 10 is capable of achieving a variety of different repetition rate and pulse energy combinations. For example, the repetition rate can be doubled while achieving the same output fluence as obtained from a single laser. Thus if individual lasers 1005 and 1007 each produce 0.125 millijoules per pulse at a repetition rate of 20 kilohertz, the same fluence level per pulse at a repetition rate of 40 kilohertz can be achieved by delaying the triggering of one laser relative to the other by 25 microseconds. Alternately, by simultaneously firing the two lasers, the fluence level per pulse can be doubled, e.g., 0.250 millijoules per pulse for the above example with the lasers operating at a repetition rate of 20 kilohertz. Alternately, by simultaneously firing the two lasers but operating at a lower repetition rate, much higher fluence levels can be achieved, typically on the order of 2 millijoules per pulse at a repetition rate of 5 kilohertz for the above-identified lasers.

An additional benefit of system 1000, at least for some applications, is that beam 1013 is comprised of two separate beams of differing polarization. This is advantageous for some materials in which polarized laser light produces undesired asymmetric etching/cutting rates. If desired, an optional waveplate 1019 can be placed within output beam 1013, thus achieving an output beam comprised of both right-circularly polarized and left-circularly polarized light.

Figure 11:
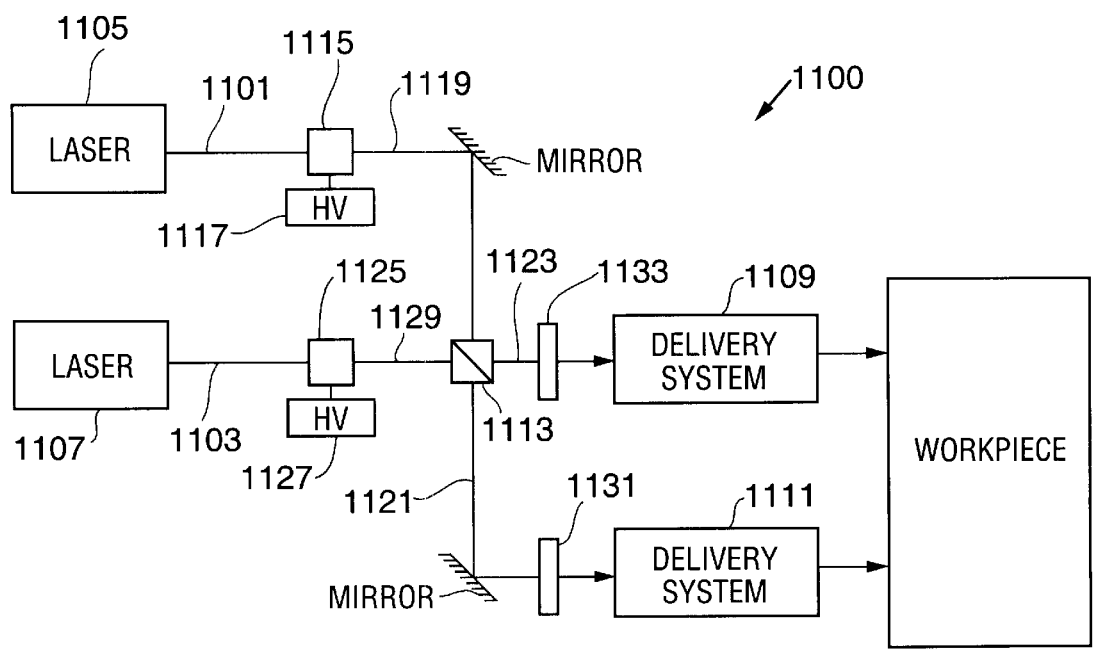
FIG. 11 is an illustration of an alternate embodiment of the invention utilizing EO modulators.

FIG. 11 illustrates another embodiment of the invention combining attributes of both systems 400 and 1000. In this embodiment output beams 1101 and 1103 from lasers 1105 and 1107, respectively, are directed to beam delivery systems 1109 and 1111 using a cube polarizer 1113 or other suitable polarization sensitive optic (e.g., polarizing beam splitter). Prior to impinging on optic 1113, output beam 1101 passes through an EO modulator 1115 coupled to a high voltage source 1117. The voltage applied to EO modulator 1115 controls the polarization of beam 1119, and thus whether beam 1119 passes through polarizer 1113 along path 1121 or is reflected by polarizer 1113 along path 1123. Similarly, the voltage applied to EO modulator 1125 by high voltage source 1127 controls the polarization of beam 1129, and determines whether beam 1129 passes through polarizer 1113 along path 1123 or is reflected by polarizer 1113 along path 1121. Accordingly, by controlling the polarization of beams 1119 and 1129 via EO modulators 1115 and 1125, one or both laser system output beams can be directed along beam paths 1121 and/or 1123.

The system illustrated in FIG. 11 can be used in a variety of applications without requiring complex system redesign due to the use of independent EO modulators 1115 and 1125. For example, as described in reference to system 1000, system 1100 allows the power per pulse to be doubled or the repetition rate to be doubled with no attendant loss of power. These results are achieved by sending both beams 1119 and 1129 through a single beam delivery system, i.e., either delivery system 1109 or delivery system 1111. Alternately, as described in reference to system 400, system 1100 can be used to simultaneously pass output beams through two beam delivery systems, thus allowing two locations on a single workpiece or two locations on two different workpieces to undergo simultaneous processing. As previously described, this configuration is particularly advantageous for achieving higher repetition rates or longer pulse durations than would be typically available from a single solid-state laser source.

Those of skill in the art will appreciate that the polarization of output beams 1121 and 1123 can be altered as desired. For example, wave plates 1131 and 1133 can be placed within output beams 1121 and 1123, respectively.

As will be understood by those familiar with the art, the present invention may be embodied in other specific forms without departing from the spirit or essential characteristics thereof. For example, more than three laser systems can be utilized in order to provide additional configuration flexibility. Also, the invention is not limited to those types of lasers or harmonic generators specifically disclosed. Accordingly, the disclosures and descriptions herein are intended to be illustrative, but not limiting, of the scope of the invention which is set forth in the following claims.

What is claimed is:

1. A method of ablating a material, the method comprising the steps of:
   generating a first plurality of pulses from a first laser system, said first plurality of pulses having a first pulse repetition rate, a first average peak power per pulse, and a first average pulse duration, wherein said first laser system is further comprised of at least a first laser source;
   directing said first plurality of pulses to a beam splitter;
   generating a second plurality of pulses from a second laser system, said second plurality of pulses having a second pulse repetition rate, second average peak power per pulse, and a second average pulse duration, wherein said second laser system is further comprised of at least a second laser source;
   directing said second plurality of pulses to said beam splitter;
   combining at least a portion of said first plurality of pulses and at lest a portion of said second plurality of pulses with said beam splitter to form a combined output beam;
   directing said combined output beam with a beam delivery system to the material, wherein said combined output beam ablates a portion of the material;
   selecting said second pulse repetition rate substantially equivalent to said first pulse repetition rate; and
   selecting a delay period less than said first average pulse duration, wherein said second plurality of pulses are staggered from said first plurality of pulses by said selected delay period.

2. The method of claim 1, further comprising the step of selecting a multi-layered material as the material, wherein said multi-layered material is comprised of at least two layers of different composition.

3. The method of claim 1, further comprising the step of selecting a multi-layered material as the material, wherein said multi-layered material is comprised of at least one metallic layer and at least one non-metallic layer.

4. The method of claim 1, wherein said step of directing said combined output beam further comprises the step of forming a via in the material, said via selected from the group of vias consisting of through-hole vias and blind vias.

5. The method of claim 1, further comprising the steps of:
   combining at least a second portion of said first plurality of pulses and at least a second portion of said second plurality of pulses with said beam splitter to form a second combined output beam; and
   directing said second combined output beam with a second beam delivery system.

6. The method of claim 5, wherein said step of directing said second combined output beam further comprises the step of directing said second combined output beam at the material, wherein said combined output beam ablates a second portion of the material.

7. The method of claim 6, wherein said first portion of the material and said second portion of the material are co-located.

8. The method of claim 5, wherein said step of directing said second combined output beam further comprises the step of directing said second combined output beam at a second material, wherein said second combined output beam ablates a portion of said second material.

9. The method of claim 1, further comprising the step of selecting said beam splitter from polarizing beam splitters and semi-reflective beam splitters.

10. The method of claim 1, further comprising the steps of:
    generating a third plurality of pulses from a third laser system, said third plurality of pulses having a third pulse repetition rate, a third average peak power per pulse, and a third average pulse duration;
    directing said third plurality of pulses to said beam splitter;
    combining at least a portion of said third plurality of pulses with said portion of said first plurality of pulses and said portion of said second plurality of pulses to form said combined output beam, said combining step performed with said beam splitter;
    selecting said third pulse repetition rate substantially equivalent to said second pulse repetition rate; and
    selecting a second delay period less than said second average pulse duration, wherein said third plurality of pulses are staggered from said second plurality of pulses by said selected second delay period.

11. The method of claim 1, wherein said selected delay period is substantially equivalent to zero and wherein said first plurality of pulses and said second plurality of pulses are substantially concurrent.

12. The method of claim 1, further comprising the step of interposing a waveplate between said beam splitter and said beam delivery system.

13. The method of claim 1, further comprising the steps of:
    passing said first plurality of pulses through a first EO modulator prior to directing said first plurality of pulses to said beam splitter; and
    passing said second plurality of pulses through a second EO modulator prior to directing said second plurality of pulses to said beam splitter.

14. The method of claim 1, wherein said first laser system produces ultraviolet radiation and is comprised of a first solid-state laser and a first nonlinear optical converter and said first pulse repetition rate is in the range of 5 to 30 kilohertz, and wherein said second laser system produces ultraviolet radiation and is comprised of a second solid-state laser and a second nonlinear optical converter and said second pulse repetition rate is in the range of 5 to 30 kilohertz.

15. The method of claim 1, wherein said first laser system produces ultraviolet radiation and is comprised of a first solid-state laser and a first nonlinear optical converter and said first average pulse duration is less than 100 nanoseconds, and wherein said second laser system produces ultraviolet radiation and is comprised of a second solid-state laser and a second nonlinear optical converter and said second average pulse duration is less than 100 nanoseconds.

16. A method of ablating a material, the method comprising the steps of:

generating a first plurality of pulses from a first ultraviolet laser system, said first plurality of pulses having a first pulse repetition rate, a first average peak power per pulse, and a first average pulse duration, wherein said first ultraviolet laser system is further comprised of at least a first laser source;

passing said first plurality of pulses through a first EO modulator, wherein said first plurality of pulses has a first polarization when said first EO modulator is of a first state and wherein said first plurality of pulses has a second polarization when said first EO modulator is of a second state;

directing said first plurality of pulses to a polarizing beam splitter, wherein said polarizing beam splitter passes said first plurality of pulses with said first polarization along a first beam path and wherein said polarizing beam splitter reflects said first plurality of pulses with said second polarization along a second beam path;

generating a second plurality of pulses from a second ultraviolet laser system, said second plurality of pulses having a second pulse repetition rate, a second average peak power per pulse, and a second average pulse duration, wherein said second ultraviolet laser system is further comprised of at least a second laser source;

passing said second plurality.of pulses through a second EO modulator, wherein said second plurality of pulses has a third polarization when said second EO modulator is of a first state and wherein said second plurality of pulses has a fourth polarization when said second EO modulator is of a second state;

directing said second plurality of pulses to said polarizing beam splitter, wherein said polarizing beam splitter passes said second plurality of pulses with said third polarization along said first beam path and wherein said polarizing beam splitter reflects said second plurality of pulses with said fourth polarization along said second beam path;

directing said first plurality of pulses within said first beam path and said second plurality of pulses within said first beam path to a first ablation site with a first beam delivery system; and directing said first plurality of pulses within said second beam path and said second plurality of pulses within second beam path to a second ablation site with a second beam delivery system.

17. The method of claim 16, further comprising the steps of:

interposing a first waveplate within said first beam path; and interposing a second waveplate within said second beam path.

18. A multi-layer material via drilling system, comprising a first solid-state laser comprised of at least a first laser source;

a first nonlinear optical converter, wherein said first solid-state laser in conjunction with said first nonlinear optical converter outputs ultraviolet radiation;

a first modulator producing a first plurality of pulses from said ultraviolet radiation output by said first solid-state laser and said first nonlinear optical converter, said first plurality of pulses having a first pulse repetition rate of 30 kilohertz or less and a first average pulse duration;

a beam splitter, wherein said first plurality of pulses are directed at said beam splitter, wherein said beam splitter directs at least a portion of said first plurality of pulses along a first output beam path;

a first beam delivery system, wherein said portion of said first plurality of pulses directed along said first output beam path pas through said first beam delivery system;

a first multi-layered target material, wherein said portion of said plurality of pulses passing through said first beam delivery system are directed to a location on said first multi-layered target material, wherein said portion of said first plurality of pulses ablate a portion of said first multi-layered target material to form a via, said via selected from the group consisting o through-hole vias and blind vias;

a second solid-state laser comprised of at least a second laser source;

a second nonlinear optical converter, wherein said second solid-state laser in conjunction with said second nonlinear optical converter outputs ultraviolet radiation;

a second modulator producing a second plurality of pulses from said ultraviolet radiation output by said second solid-state laser and said second nonlinear optical converter, said second plurality of pulses having a pulse repetition rate substantially equivalent to said first pulse repetition rate, wherein said second plurality of pulses are delayed from said first plurality of pulses by a delay period that is less than said first average pulse duration, wherein said second plurality of pulses are directed at said beam splitter, wherein said beam splitter directs at least a portion of said second plurality of pulses along said first output bam path through said first beam delivery system to said location on said said first multi-layered target material, wherein said portion of said second plurality of pulses assist in ablating said portion of said first multi-layered target-material.

19. The method of claim 18, wherein said first average pulse duration is 100 nanoseconds or less.

20. The multi-layer material via drilling system of claim 18, further comprising a second beam delivery system, wherein said beam splitter directs a second portion of said first plurality of pulses and a second portion or said second plurality of pulses along a second output beam path through said second beam delivery system to a second location on said first multi-layered target material, wherein said second portion of said first plurality of pulses and said second portion of said second plurality of pulses ablate a second portion of said first multi-layered target material to form a second via, said second via selected from the group consisting of through-hole vias and blind vias.

21. The multi-layer material via drilling system of claim 18, further comprising a second beam delivery system, wherein said beam splitter directs a second portion of said first plurality of pulses and a second portion of said second plurality of pulses along a second output beam path through said second beam delivery system to a second location on a second multi-layered target material, wherein said second portion of said first plurality of pulses and said second portion of said second plurality of pulses ablate a portion of said second multi-layered target material to form a second via, said second via selected from the group consisting of through-hole vias and blind vias.

22. The multi-layer material via drilling system of claim 18, further comprising a waveplate interposed between said beam splitter and said first multi-layered target material.

23. The multi-layer material via drilling system of claim 18, wherein said beam splitter is selected from the group consisting of semi-reflective beam splitters and polarizing beam splitters.

24. The multi-layer material via drilling system of claim 18, wherein said first solid-state laser is a first Nd-laser and said second solid-state laser is a second Nd-laser.

25. The multi-layer material via drilling system of claim 18, further comprising:

- a first EO modulator interposed between said first solid-state laser and said beam splitter, said first EO modulator having a first state of operation and a second state of operation, wherein said beam splitter directs said portion of said first plurality of pulses along said first output beam path when said first EO modulator is in said first state of operation, and wherein said beam splitter directs said portion of said first plurality of pulses along said second output beam path when said first EO modulator is in said second state of operation; and

- a second EO modulator interposed between said second solid-state laser and said beam splitter, said second EO modulator having a first state of operation and a second state of operation, wherein said beam splitter directs said portion of said second plurality of pulses along said first output beam path when said second EO modulator is in said first state of operation, and wherein said beam splitter directs said portion of said second plurality of pulses along said second output beam path when said second EO modulator is in said second state of operation.

* * * * *